United States Patent
Shen et al.

(10) Patent No.: US 10,350,717 B2
(45) Date of Patent: Jul. 16, 2019

(54) ELECTRONIC APPARATUS PRODUCTION SYSTEM

(71) Applicants: Tyco Electronics (Shanghai) Co. Ltd., Shanghai (CN); Tyco Electronics (Dongguan) Co. Ltd., Guangdong (CN); Tyco Electronics Corporation, Berwyn, PA (US); Zhuhai Yingzhi Tech Co., Ltd., Zhuhai (CN)

(72) Inventors: Hongzhou Shen, Dongguan (CN); Dandan Zhang, Shanghai (CN); Kok Wai Wong, Zhuhai (CN); George Dubniczki, Berwyn, PA (US)

(73) Assignees: TE Connectivity Corporation, Berwyn, PA (US); Tyco Electronics (Dongguan) Co. Ltd., Dongguan (CN); Zhuhai Yingzhi Tech Co. Ltd., Zhuhai (CN); Tyco Electronics (Shanghai) Co. Ltd., Shanghai (CN)

(*) Notice: Subject to any disclaimer, the term of this patent is extended or adjusted under 35 U.S.C. 154(b) by 316 days.

(21) Appl. No.: 15/350,586

(22) Filed: Nov. 14, 2016

(65) Prior Publication Data

US 2017/0057026 A1    Mar. 2, 2017

Related U.S. Application Data

(63) Continuation of application No. PCT/IB2015/053552, filed on May 14, 2015.

(30) Foreign Application Priority Data

May 14, 2014 (CN) .......................... 2014 1 0202796

(51) Int. Cl.
B23P 19/00 (2006.01)
B23P 21/00 (2006.01)
(Continued)

(52) U.S. Cl.
CPC ........... *B23P 19/001* (2013.01); *B23P 19/007* (2013.01); *B23P 21/004* (2013.01); *B25J 9/0084* (2013.01);
(Continued)

(58) Field of Classification Search
CPC .. H05K 13/02; H05K 13/021; H05K 13/0215; H05K 13/028; H05K 13/029;
(Continued)

(56) References Cited

U.S. PATENT DOCUMENTS 5,103,964 A * 4/1992 Sticht .................... B23P 21/004
198/465.1
5,125,149 A * 6/1992 Inaba .................... B23P 19/001
198/341.05
(Continued)

FOREIGN PATENT DOCUMENTS

CN        202922583 U    5/2013
DE   202011002465 U1    6/2011
(Continued)

OTHER PUBLICATIONS

Machine translation of JPs63295135 provided by EPO website (Espacenet.com) (Year: 1988).*
(Continued)

*Primary Examiner* — Peter Dungba Vo
*Assistant Examiner* — Joshua D Anderson
(74) *Attorney, Agent, or Firm* — Barley Snyder

(57) ABSTRACT

An electronic apparatus production system is disclosed. The electronic apparatus production system comprises a transmission rail in the form of a substantially closed loop, a plurality of storage trays circulating on the transmission rail, each of the storage trays comprising a plurality of holding portions to hold a plurality of components with different shapes, an automatic distributor configured to mount the
(Continued)

components with different shapes on respective holding portions, and an automatic assembler configured to grip the components on the storage tray.

24 Claims, 20 Drawing Sheets

(51) Int. Cl.
*B25J 15/00* (2006.01)
*B25J 9/00* (2006.01)
*B65G 37/02* (2006.01)
*B65G 47/14* (2006.01)
*H05K 13/02* (2006.01)
*H05K 13/08* (2006.01)
*H05K 13/04* (2006.01)
*B65G 47/94* (2006.01)
*B65G 47/18* (2006.01)

(52) U.S. Cl.
CPC ......... *B25J 9/0093* (2013.01); *B25J 15/0057* (2013.01); *B65G 37/02* (2013.01); *B65G 47/1421* (2013.01); *B65G 47/1428* (2013.01); *B65G 47/18* (2013.01); *B65G 47/945* (2013.01); *H05K 13/021* (2013.01); *H05K 13/028* (2013.01); *H05K 13/0434* (2013.01); *H05K 13/086* (2018.08); *H05K 13/0452* (2013.01); *Y10T 29/49828* (2015.01); *Y10T 29/53317* (2015.01); *Y10T 29/53365* (2015.01); *Y10T 29/53383* (2015.01); *Y10T 29/53435* (2015.01)

(58) Field of Classification Search
CPC ............. H05K 13/043; H05K 13/0434; H05K 13/0452; H05K 13/086; Y10T 29/49828; Y10T 29/53313; Y10T 29/53317; Y10T 29/53365; Y10T 29/5337; Y10T 29/53378; Y10T 29/53383; Y10T 29/534; Y10T 29/53409; Y10T 29/53435; B23P 19/001; B23P 19/004; B23P 19/007; B25J 9/0093; B25J 9/0096; B65G 37/02; B65G 47/02; B65G 47/12; B65G 47/14; B65G 47/1421; B65G 47/1429; B65G 47/1478; B65G 47/16; B65G 47/18; B65G 47/20; B65G 47/945

See application file for complete search history.

(56) References Cited

U.S. PATENT DOCUMENTS

| 5,319,845 A | 6/1994 | Watanabe et al. |
| 2003/0088974 A1* | 5/2003 | Nakamura ............ H05K 13/02 29/740 |
| 2010/0063629 A1 | 3/2010 | Battisti et al. |
| 2013/0055560 A1 | 3/2013 | Nakasugi et al. |

FOREIGN PATENT DOCUMENTS

| DE | 102011107967 A1 | 1/2013 |
| JP | 63295135 A | 12/1988 |
| JP | 106154 A | 1/1998 |
| JP | 2002326127 A | 11/2002 |
| JP | 2003170319 A | 6/2003 |
| KR | 100787186 B1 | 12/2007 |

OTHER PUBLICATIONS

Machine translation of DE 102011107967 provided by EPO website (Espacenet.com) (Year: 2013).*
PCT International Search Report and Written Opinion of the Searching Authority, dated Oct. 5, 2015, 13 pages.
Abstract of JPS63295135, dated Dec. 1, 1988, 2 pages.
Abstract of JP2003170319, dated Jun. 17, 2003, 2 pages.
Abstract of JP2002326127, dated Nov. 12, 2002, 2 pages.
Abstract of DE102011107967, dated Jan. 24, 2013, 1 page.
Abstract of KR100787186, dated Dec. 24, 2007, 1 page.
Abstract of CN202922583, dated May 8, 2013, 1 page.
Abstract of DE202011002465, dated Jun. 1, 2011, 1 page.
Abstract of JPH106154, dated Jan. 13, 1998, 1 page.

* cited by examiner

ELECTRONIC APPARATUS PRODUCTION SYSTEM

CROSS-REFERENCE TO RELATED APPLICATIONS

This application is a continuation of PCT International Application No. PCT/IB2015/053552, filed on May 14, 2015, which claims priority under 35 U.S.C. § 119 to Chinese Patent Application No. 201410202796.9, filed on May 14, 2014.

FIELD OF THE INVENTION

The present invention relates to an electronic apparatus production system, and more particularly, to an electronic apparatus production system configured to assemble scattered different components into an electronic apparatus.

BACKGROUND

Generally, an electronic apparatus, for example, an electrical connector, a fiber optic connector, a relay or the like, comprises a great number of components such as a case, a contact, a spring, a bolt, an insulation block, and other components known to those with ordinary skill in the art. During manufacturing of such an electronic apparatus, the components must be prepared with different shapes and different functions in advance; these components are then selected manually or by a robot according to a preset program and are assembled into the electronic apparatus on a worktable by the robot.

SUMMARY

An object of the invention, among others, is to provide a more efficiently automated electronic apparatus production system. The disclosed electronic apparatus production system comprises a transmission rail in the form of a substantially closed loop, a plurality of storage trays circulating on the transmission rail, each of the storage trays comprising a plurality of holding portions to hold a plurality of components with different shapes, an automatic distributor configured to mount the components with different shapes on respective holding portions, and an automatic assembler configured to grip the components on the storage tray.

BRIEF DESCRIPTION OF THE DRAWINGS

The invention will now be described by way of example with reference to the accompanying figures, of which.

DETAILED DESCRIPTION OF THE EMBODIMENT(S)

The invention is explained in greater detail below with reference to embodiments of an electronic apparatus production system. This invention may, however, be embodied in many different forms and should not be construed as limited to the embodiments set forth herein; rather, these embodiments are provided so that this disclosure will be thorough and complete and still fully convey the scope of the invention to those skilled in the art.

Figure 1:
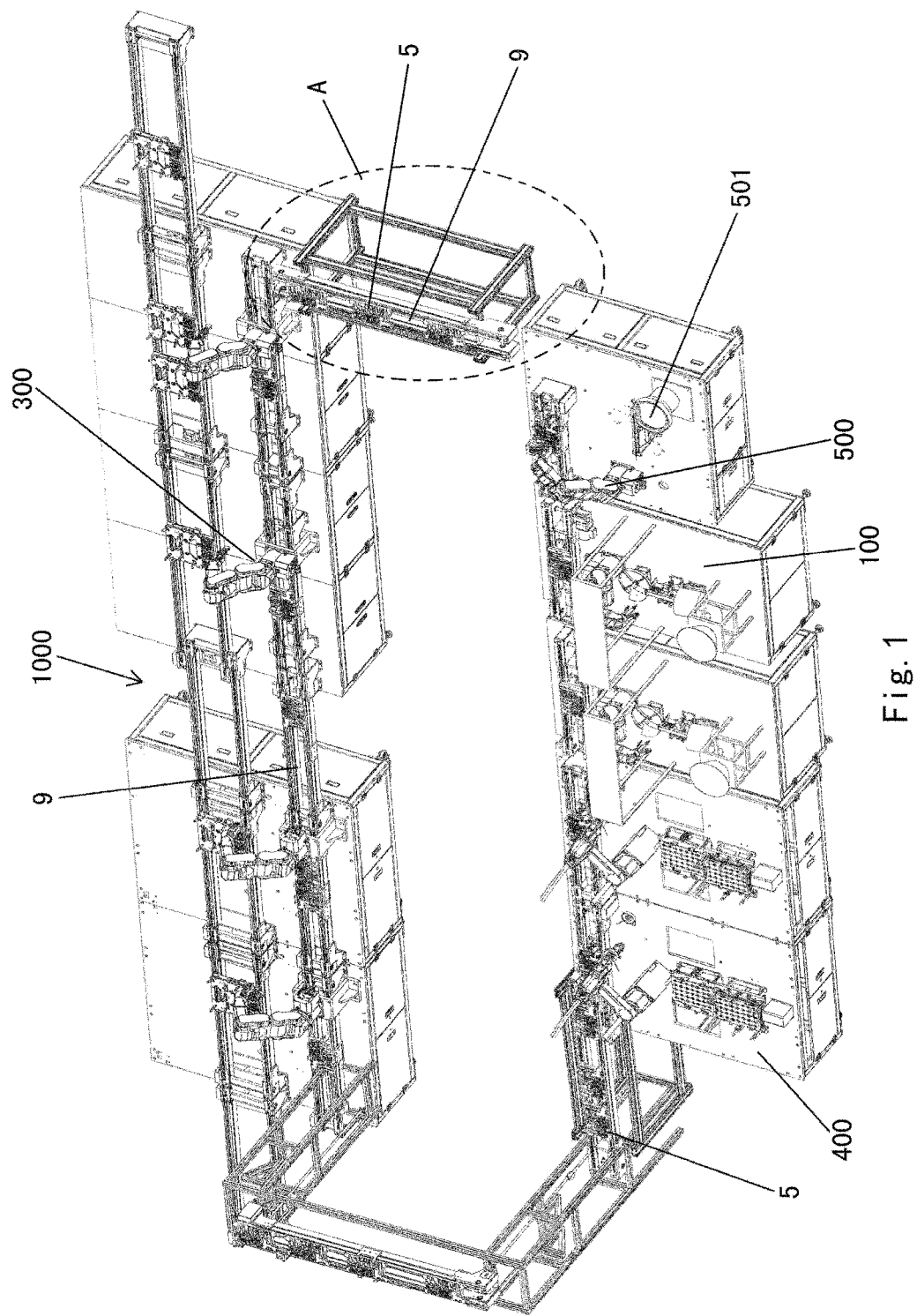
FIG. 1 is a perspective view of an electronic apparatus production system according to the invention.

An electronic apparatus production system 1000 according to the invention is shown generally in FIG. 1. The electronic apparatus production system 1000 comprises a transmission rail 9 in the form of a substantially closed loop, a plurality of storage trays 5 circulating on the transmission rail 9, each of the storage trays 5 comprising a plurality of holding portions 51, shown in FIG. 14, to hold components 200 with different shapes, at least one automatic distributor 100 configured to mount the components 200 with different shapes on the respective holding portions 51, and at least one automatic assembler 300 configured to grip the components 200 from the storage tray 5 and assemble the gripped components into an electronic apparatus.

Figure 6:
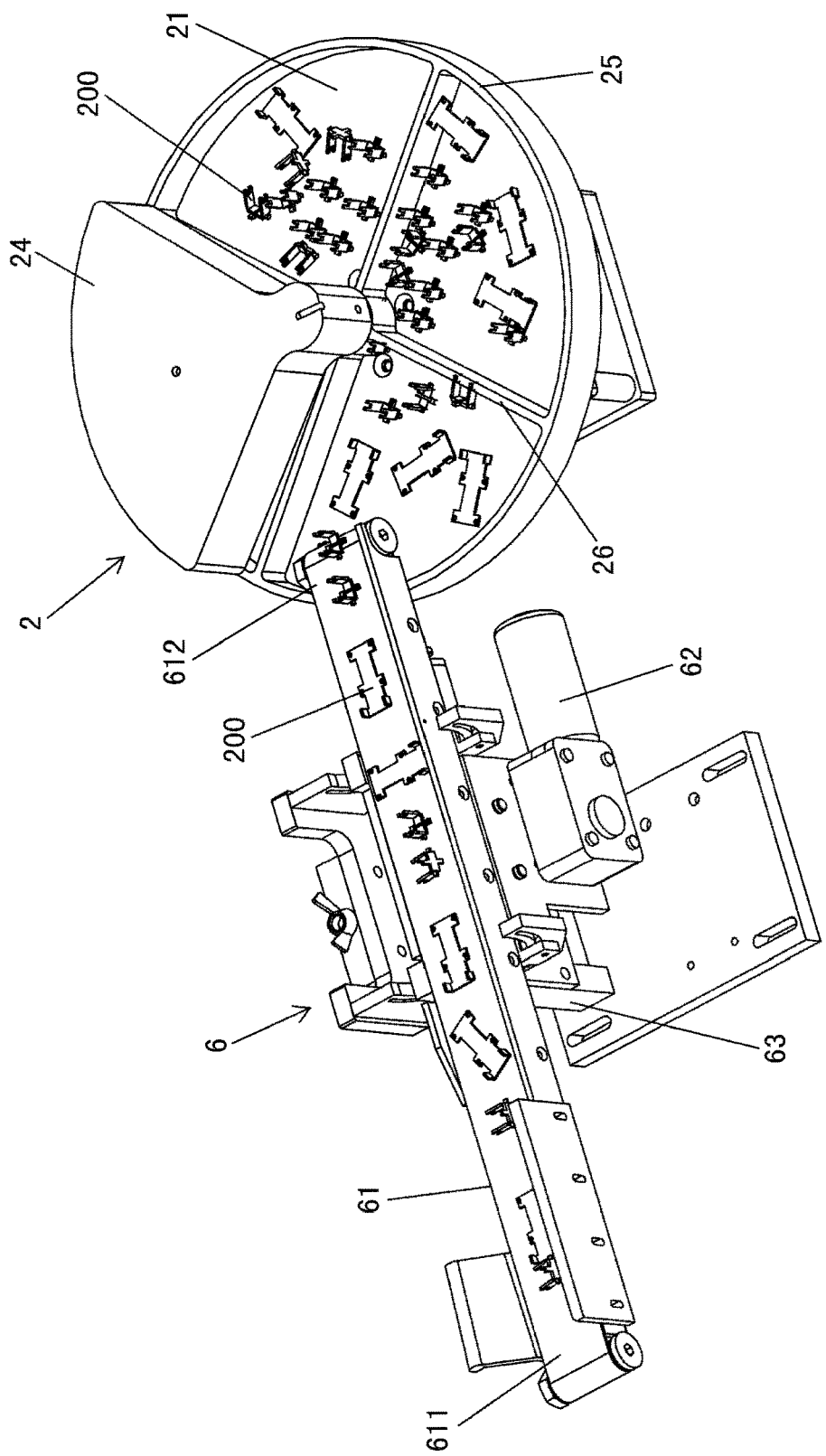
FIG. 6 is a perspective view of a first transmission device and a storage device of the automatic distributor of FIG. 2.
Figure 17:
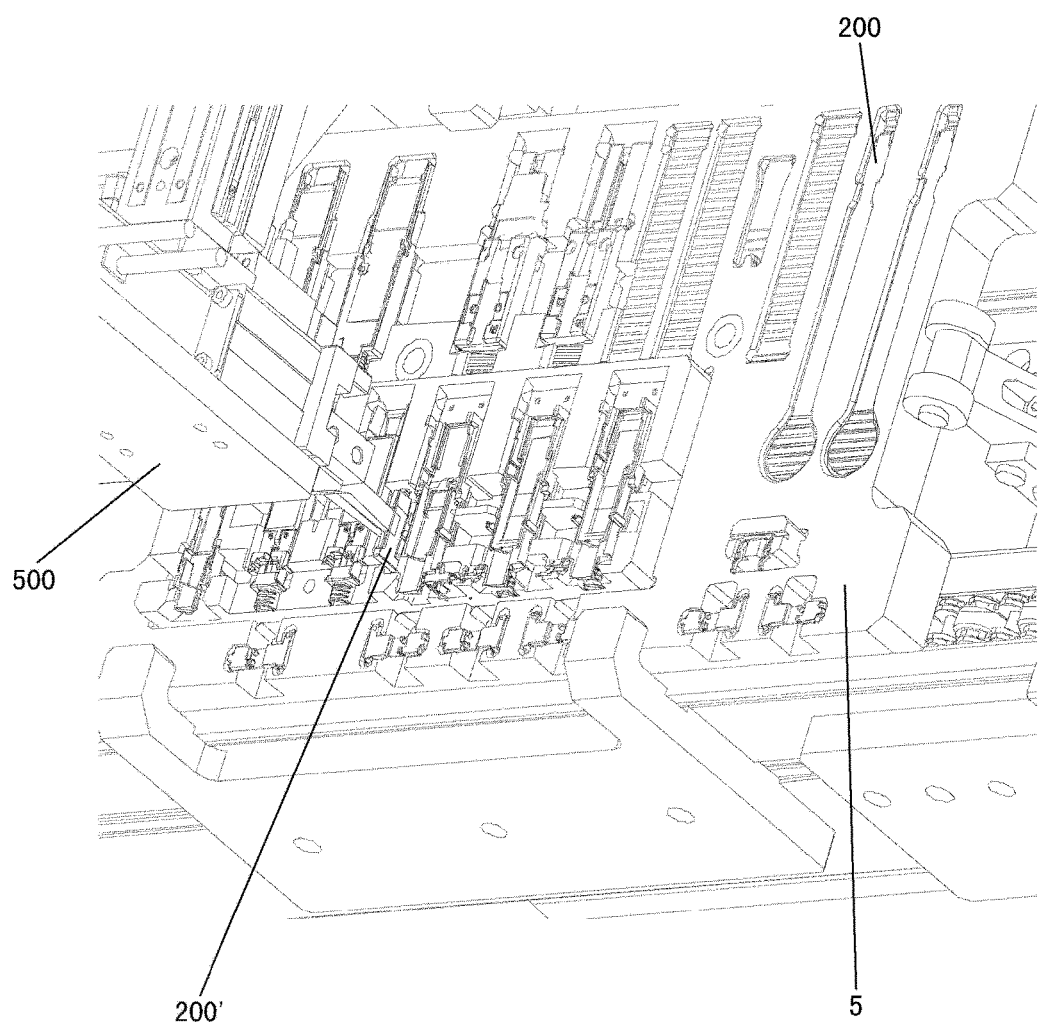
FIG. 17 is a perspective view of the storage tray and the third robot of FIG. 16.

The components 200, as shown in FIGS. 6 and 17, are assembled into the electronic apparatus, such as an electrical connector, a fiber optic connector, a relay or the like, in a subsequent operation process. These components 200 may be a case, a contact, a spring, a bolt, an insulation block, a wire and the like mixed together. Different types of components 200 have different shapes, sizes, flexibilities, and functions, as would be understood by one with ordinary skill in the art.

The automatic distributor 100 is shown in FIGS. 2-7. The automatic distributor 100 is configured to distribute a variety of components 200 with different shapes. The automatic distributor 100 comprises a base 1 having, for example, a box shape, a storage device 2, a recognition device 3, and a pickup device 4. The storage device 2 is mounted on the base 1 and configured to store a plurality of components 200. The recognition device 3 is configured to recognize the components 200 stored on the storage device 2, for example, recognize the parameters such as the shape, the size or the weight of the components 200. The pickup device 4 is configured to pick up the recognized components 200 based on a recognition result of the recognition device 3, so as to place the picked components 200 on another preset location.

Figure 5:
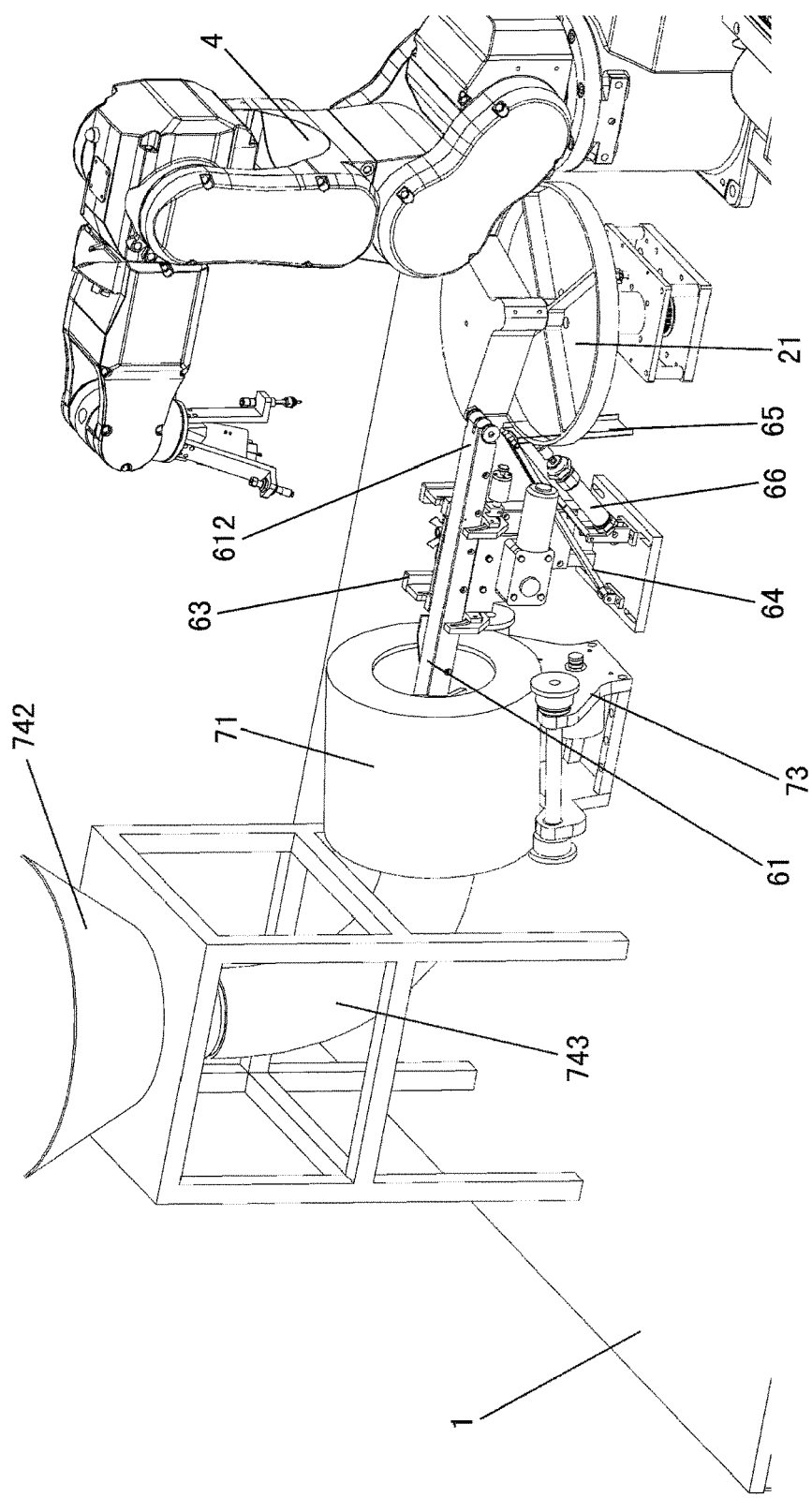
FIG. 5 is an enlarged perspective view of the automatic distributor of FIG. 2.
Figure 7:
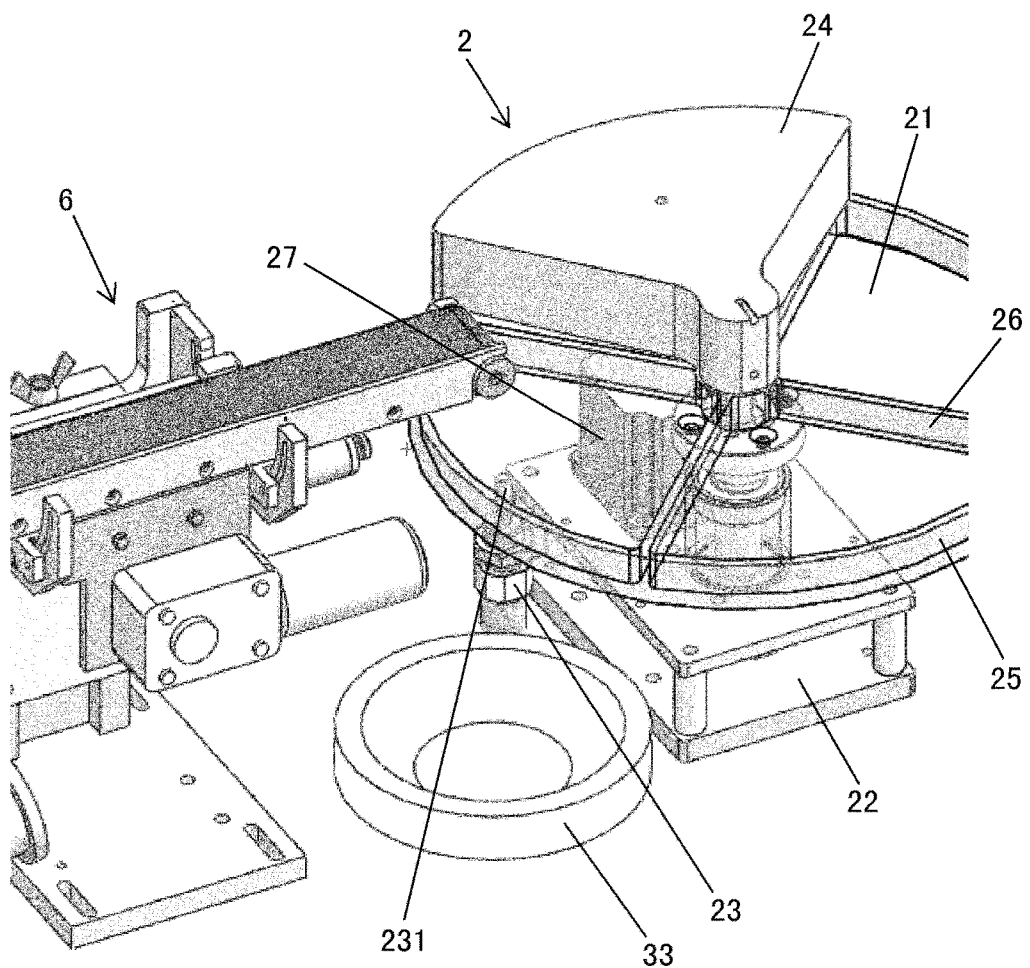
FIG. 7 is a perspective view of the first transmission device and the storage device of FIG. 6.

The storage device 2, as shown in FIGS. 5-7, comprises a support tray 21 configured to place the components 200 thereon and a first support seat 22 mounted on the base 1. The support tray 21 is mounted on the first support seat 22. In an embodiment, the support tray 21 has a substantially circular shape, and an axis of the support tray 21 is perpendicular to a horizontal plane. As would be understood by one with ordinary skill in the art, the support tray 21 is not limited to a circular shape, and may alternatively have an oval shape, a square shape, a rectangle shape or any other polygon shape, and the support tray 21 may be configured to be unable to rotate.

The storage device 2 further comprises a first motor 27 mounted on the first support seat 22. The first motor 27 is configured to drive the support tray 21 to rotate. A plurality of division plates 26 extending in a radial direction are provided on the support tray 21, so as to divide the support tray 21 into a plurality of storage sections, for example, four storage sections, having a substantially fanlike shape. In this way, one of the storage sections may be used to receive components in a position, and after being rotated by a predetermined angle, for example, 90 degrees, the recognition device 3 recognizes the components, and the pickup device 4 picks up the recognized components.

As shown in FIG. 7, a ring-shaped blocking plate 25 is provided on the periphery of the support tray 21, so as to block the components 200 from falling out from an edge of the support tray 21. A fanlike blocking plate 24 is provided on the support tray 21, the fanlike blocking plate 24 is arranged to block the components 200 from bouncing out of the support tray 21 after the components 200 drops onto the support seat 21. It should be appreciated that the fanlike blocking plate 24 does not cover the storage section which is receiving the components.

The storage device 2, as shown in FIG. 7, further comprises a vibration device 23 mounted on the base 1 under the support tray 21 and configured to vibrate the support tray 21. In another embodiment, the vibration device 23 vibrates the support tray 21. The vibration device 23 comprises a vibration head 231 and an electric excitation mechanism is provided in the vibration device 23. Upon an impulse voltage, the vibration head 231 may be quickly extended or withdrawn, hitting the support tray 21 in the extended state to vibrate the support tray 21, so as to change the posture of the components 200 on the support tray 21, for example, turn over or rotate the components 200 for facilitating the recognition device 3 to recognize the components 200.

Figure 2:
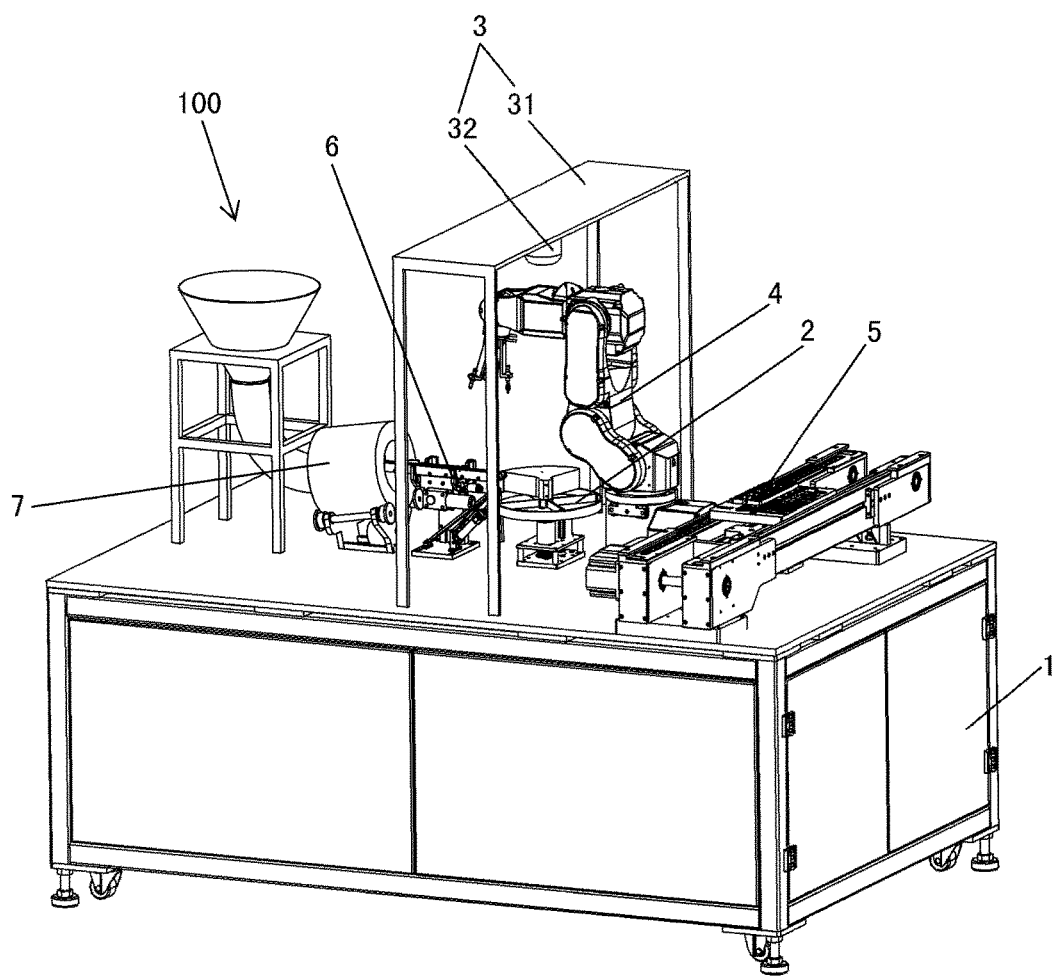
FIG. 2 is a perspective view of an automatic distributor of the electronic apparatus production system of FIG. 1.

The recognition device 3, as shown in FIGS. 2 and 7, comprises a first support frame 31 mounted on the base 1 and a camera 32, for example, a CCD camera, mounted on the first support frame 31 and pointed at one storage section on the support tray 21. The camera 32 captures images of the components 200 stored on the storage device 21. The recognition device 3 further comprises a light source 33 configured to illuminate the components 200 stored on the storage device 21. In an embodiment, the support tray 21 may be made of transparent material, the camera 32 is mounted above the support tray 21, and the light source 33 is mounted below the support tray 21. In this way, it may increase the definition of the components 200, so as to obtain a clear image of the components 200. In an alternative embodiment, the camera 32 may be mounted below the support tray 21, and the light source 33 may be mounted above the support tray 21. In another embodiment, the camera 32 and the light source 33 may be both mounted above or below the support tray 21. The image signal of the components 200 obtained by the camera 32 is transferred to a controller, and the controller analyzes and compares the image signal to recognize a position and a type of a component 200, and controls the pickup device 4 to pick up the recognized component 200.

The automatic distributor 100, as shown in FIGS. 2 and 6-10, may further comprise a first transmission device 6 configured to transmit the components 200 onto the storage device 2. The first transmission device 6 comprises a second support seat 63 mounted on the base 1, a conveyer belt assembly 61 mounted on the second support seat 63 in a longitudinal direction and comprising a receiving end 611 for receiving the components 200 and a releasing end 612 for releasing the components 200, and a second motor 62 mounted on the second support seat 63 and configured to drive a conveyer belt 614 of the conveyer belt assembly 61 to move. In this way, the conveyer belt assembly 61 transmits the components 200 received from the receiving end 611 to the releasing end 612, and drops the components 200 onto the support tray 21. As an alternative to the conveyer belt assembly 61, the first transmission device 65 may have a conveyer guide rail consisting of a plurality of rolling shafts.

The automatic distributor 100, as shown in FIGS. 2-5 and 11, may further comprise a loading device 7 configured to load the components 200 onto the receiving end 611 of the conveyer belt assembly 61. The loading device 7 comprises a rolling drum 71 orientated in a substantially horizontal direction, into which the receiving end 611 of the conveyer belt assembly 61 is inserted in a substantially horizontal direction, a driving device 73 configured to drive the rolling drum 71 to rotate, and at least one scraping plate 72 mounted on an inner wall of the rolling drum 71 in an axial direction.

Figure 11:
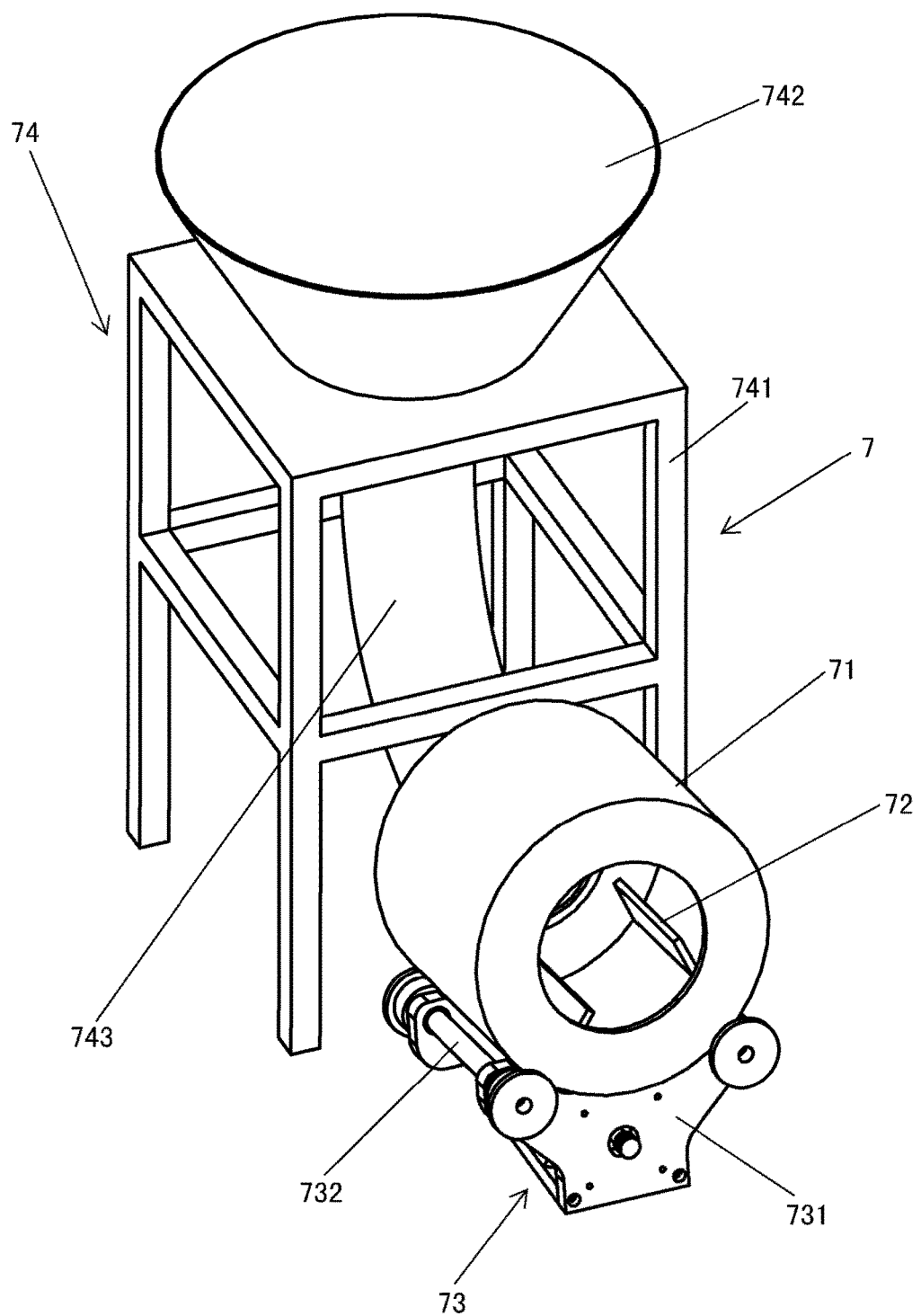
FIG. 11 is a perspective view of a loading device of the automatic distributor of FIG. 2.
Figure 12:
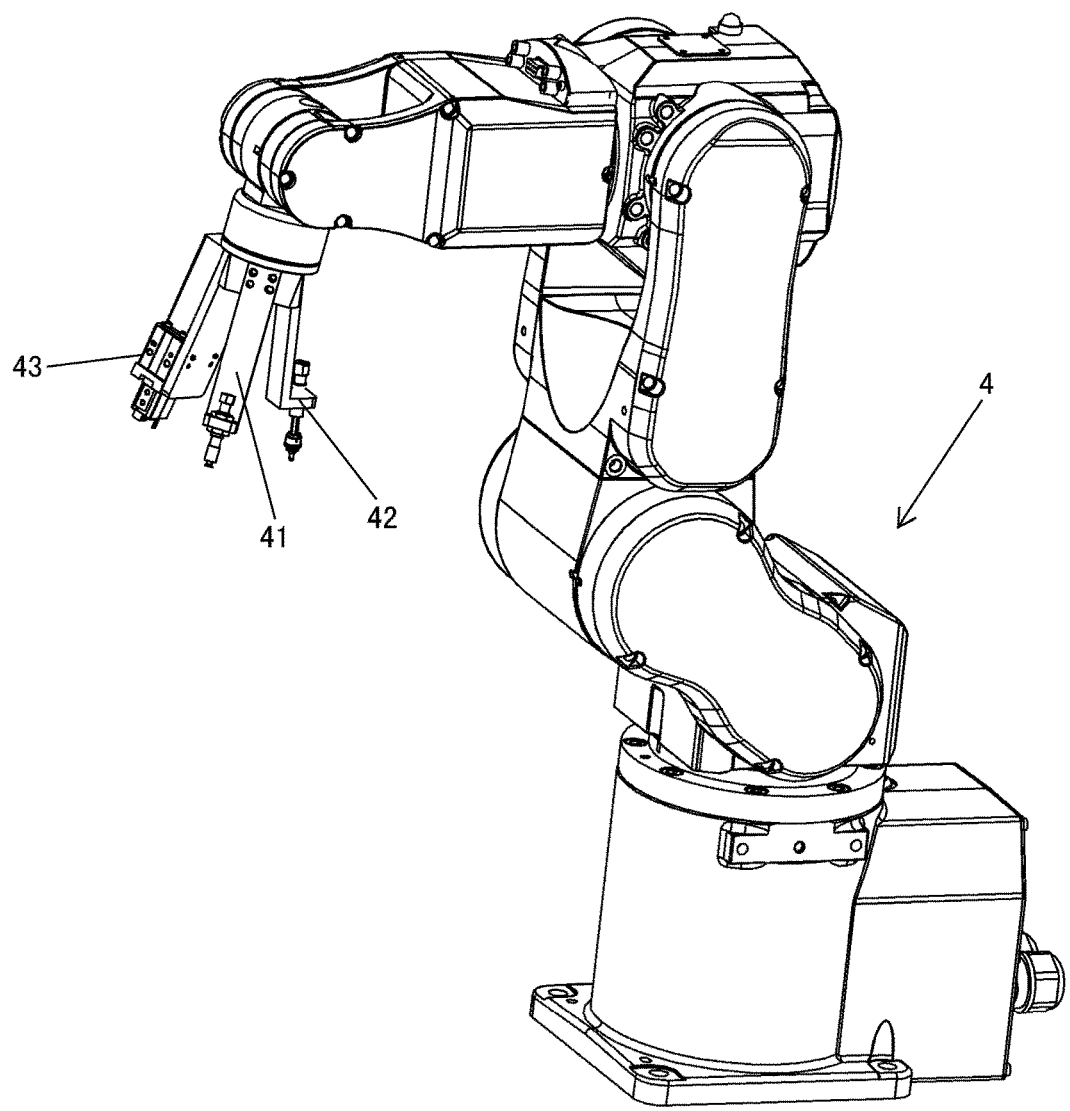
FIG. 12 is a perspective view of a first robot of the electronic apparatus production system of FIG. 1.

As shown in FIG. 11, a surface of the scraping plate 72 extends in the radial direction of the rolling drum 71. In another embodiment, a surface of the scraping plate 72 defines an angle with respect to the radial direction of the rolling drum 71. In this way, when the scraping plate 72 is located at the lowest position, the component 200 is located at the lowest position of the rolling drum 71 by gravity. During rotating the rolling drum 71, some of the components are held on the inner wall of the rolling drum 71 under the push of the scraping plate 72 and rotate with the rolling drum 71. After the rolling drum 71 is rotated by a predetermined angle, for example, an angle larger than 90 degrees, the components 200 drop from the scraping plate 72 onto the receiving end 611 of the conveyer belt assembly 61 and are transmitted to the releasing end 612 by the conveyer belt 614 of the conveyer belt assembly 61. With the rotating of the rolling drum 71, the components 200 repeatedly rise and fall in the rolling drum, which may prevent the components 200 from being entangled with each other.

The loading device 7, as shown in FIGS. 2-6 and 11, further comprises an input device 74 communicated with an inner space of the rolling drum 71 at an end of the rolling drum opposite an end of the rolling drum receiving the receiving end 611 of the conveyer belt assembly 61, so as to input the components 200 into the rolling drum 71. The input device 74 comprises a second support frame 741 mounted on the base 1, a funnel portion 742 supported on the second support frame 741 and configured to receive the components 200, and a bending portion 743 located under the funnel portion 742 and communicated with the inner space of the rolling drum 71. In this way, the components 200 input into the funnel portion 742 may slide down and enter the rolling drum 71 through the bending portion 743 by gravity.

The driving device 73, as shown in FIG. 11, comprises a third support seat 731 mounted on the base 1, a third motor mounted on the third support seat 731, and a plurality of rolling shafts 732 mounted on the third support seat and rotatably engaged with an outer surface of the rolling drum 71, so as to rotate the rolling drum 71 under the driving of the third motor. During rotating the rolling drum 71, some of the components 200 are raised by the scraping plate 72 and fall down onto the conveyer belt 614 of the conveyer belt assembly 61.

Figure 8:
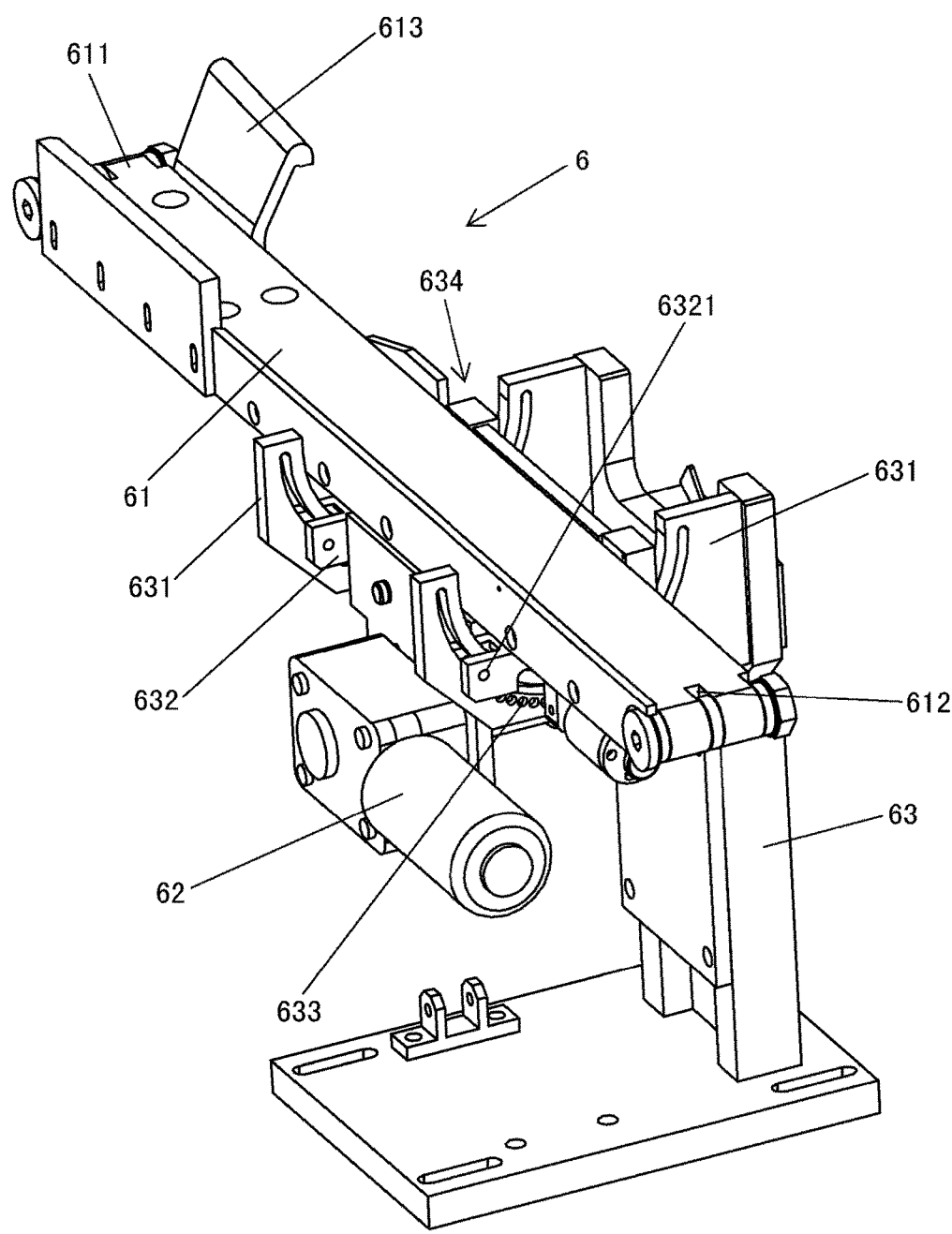
FIG. 8 is a perspective view of the first transmission device of FIG. 6.
Figure 9:
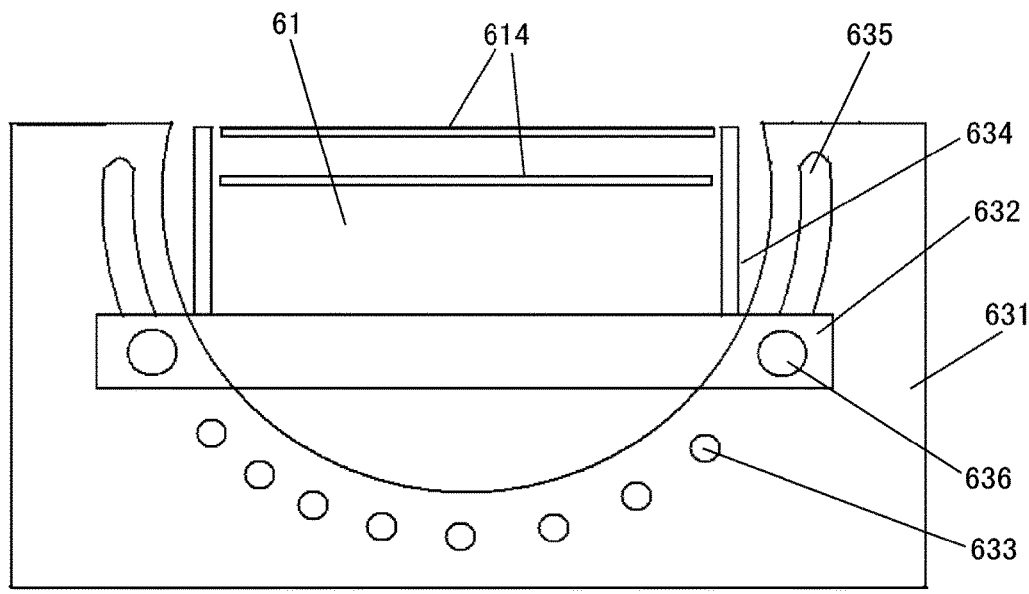
FIG. 9 is a sectional view of a second support seat and a conveyer belt assembly of the first transmission device of FIG. 6.
Figure 10:
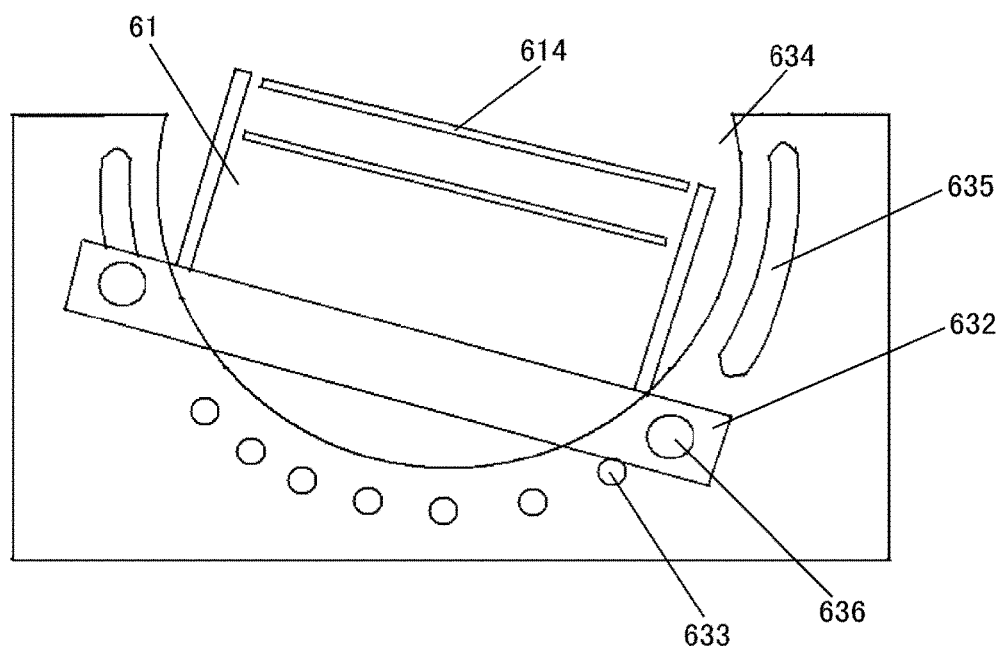
FIG. 10 is a sectional view of the second support seat and the conveyer belt assembly of FIG. 9.

As shown in FIGS. 8-10, an angle of a surface of the conveyer belt assembly 61 with respect to a horizontal plane is adjustable in a lateral direction (the left and right direction in FIGS. 9 and 10) perpendicular to a transmitting direction of the conveyer belt 614. The second support seat 63 comprises at least two arcuate brackets 631 each comprising an arcuate groove 634, a plurality of passageways 633 arranged in an arcuate shape along the periphery of the arcuate groove 634, and a lateral bracket 632 on which the conveyer belt assembly 61 is mounted. Both ends of the lateral bracket 632 are selectively engaged in two passageways of the plurality of passageways 633 by, for example, bolts, so that the lateral bracket 632 moves on a portion of the arcuate groove 634 and has a changeable posture. In order to facilitate the operation, the passageways 633 comprise a slot 635 formed at both sides of the arcuate groove 634.

As shown in FIG. 9, both ends of the lateral bracket 632 are mounted in two slots 635 in the horizontal plane by means of bolts 636, so that the lateral bracket 632 is oriented in the horizontal direction. As shown in FIG. 10, one end (left end) of the lateral bracket 632 is mounted in the slot 635 by a bolt 636, and the other end (right end) of the lateral bracket 632 is mounted in the passageway 633 by a bolt 636, so that the surface of the lateral bracket 632 is oblique with respect to the horizontal plane in the lateral direction perpendicular to the transmitting direction of the conveyer belt 614. It should be appreciated that the posture of the lateral bracket 632 is changeable by mounting the two ends of the lateral bracket 632 in different passageways. In this way, by obliquely mounting the lateral bracket 632, it may prevent the components 200 on the conveyer belt assembly 61 from being stacked on the receiving end 611, and prevent the components 200 from falling outside the rolling drum 71 from the conveyer belt 614 before arriving at the releasing end 612 during transmitting the components 200 by the conveyer belt 614. It may also be possible to adjust the number of the components 200 transmitted from the rolling drum 71 to the storage device 5 by changing the obliquity of the lateral bracket 632. In addition, at least one side of the receiving end 611 of the conveyer belt assembly 61 in a lateral direction is provided with a blocking plate 613, so as to prevent the components 200, falling onto the receiving end 611 from the scraping plate 72, from falling back into the rolling drum 71 due to bouncing.

As shown in FIG. 5, a guide device 64, 65 is provided under the releasing end 612 of the conveyer belt assembly 61, and the guide device is configured to guide the components from the conveyer belt assembly 61 toward the support tray 21 of the storage device 2. The guide device comprises a plurality of support rods 64 pivotally mounted on the second support seat 63 and a guide plate 65 mounted on upper ends of the support rods 64 and obliquely extending from the lower portion of the releasing end 612 to the storage device 2. The guide device 64, 65 guides the components 200 to slide along the guide plate 65 from the releasing end 612 to the storage device 2, decreasing the tendency of the components 200 to fall out of the storage device 2 due to bouncing. In another embodiment, the plurality of support rods 64 comprises at least one telescoping rod 66.

The pickup device 4, as shown in FIGS. 2-4 and 12, is a first robot and comprises a plurality of grippers 41-43 adapted to pick up the components 200 with different shapes. In an embodiment, the first robot includes may be a four-axis robot, a six-axis robot, or any other type of robot with multiple degrees of freedom. The first robot may recognize the images of the components 200 captured by the camera 32 according to a preset program, so as to control the grippers 41-43 to grip the respective components 200. In the embodiment shown in FIG. 12, the gripper 41 has a large sucking disc adapted to grip a contact, the gripper 42 has a small sucking disc adapted to grip a wire, the gripper 42 has a plurality of arms adapted to grip a large component 200, for example, a case of the electrical connector. One or more different types of grippers 41-43 may be mounted on the robot according to actual requirements.

Figure 14:
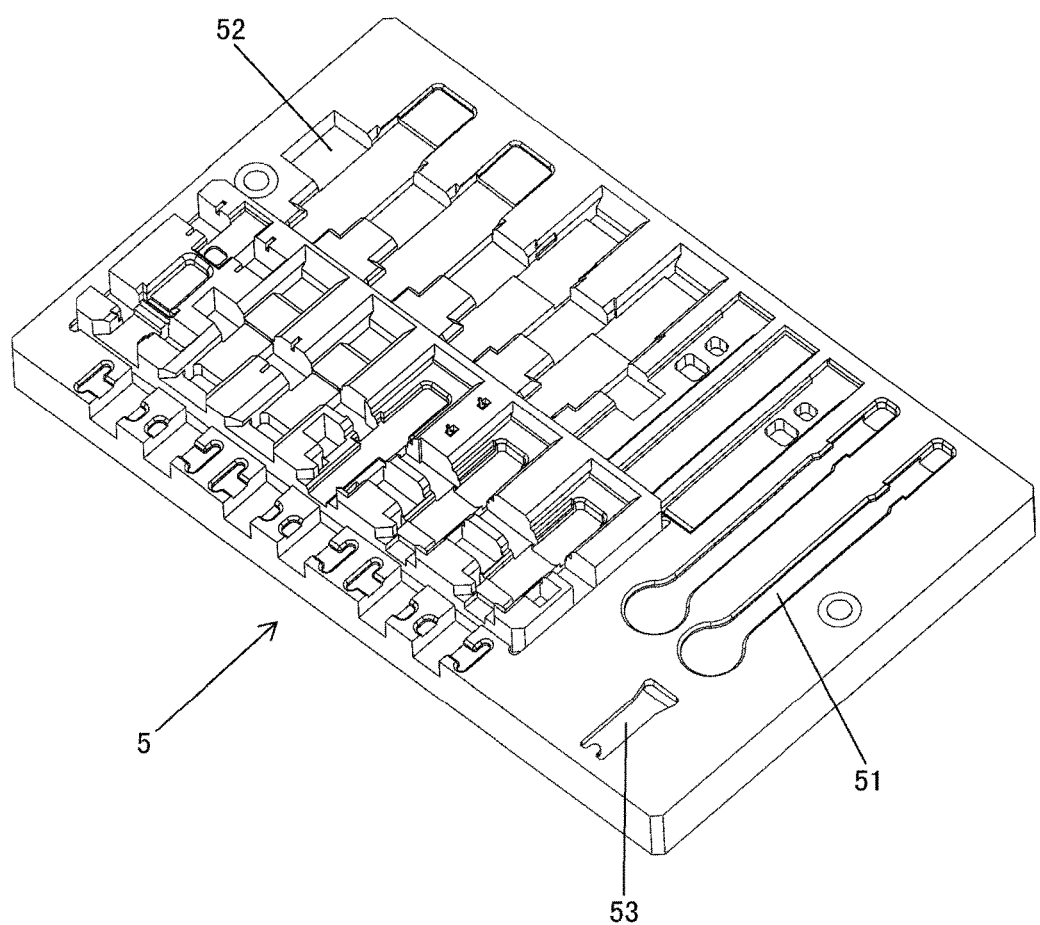
FIG. 14 is a perspective view of a storage tray of the electronic apparatus production system of FIG. 1.

One of the plurality of storage trays 5 is shown in FIG. 14. The storage tray 5 comprises a plurality of holding portions 51-53 configured to hold components 200 with different shapes. In the shown embodiment, the holding portion 51 is configured to hold a contact, the holding portion 52 is configured to hold a connector case, and the holding portion 53 is configured to hold a spring. The holding portion 51-53 is formed with a recess, and the recess is shaped to match with the external contour of the respective component 200, so that the component 200 held in the holding portion 51 does not move or fall out due to vibration. The robot, as the pickup device 4, is further configured to place the picked components 200 on the respective holding portions 51-53 of the storage tray 5 according to a preset program. For example, a group or a plurality of groups of components 200 for assembling one or more electrical connectors are placed on each storage tray 5, so as to assemble these components 200 into the electrical connector in a subsequent operation process.

Figure 13:
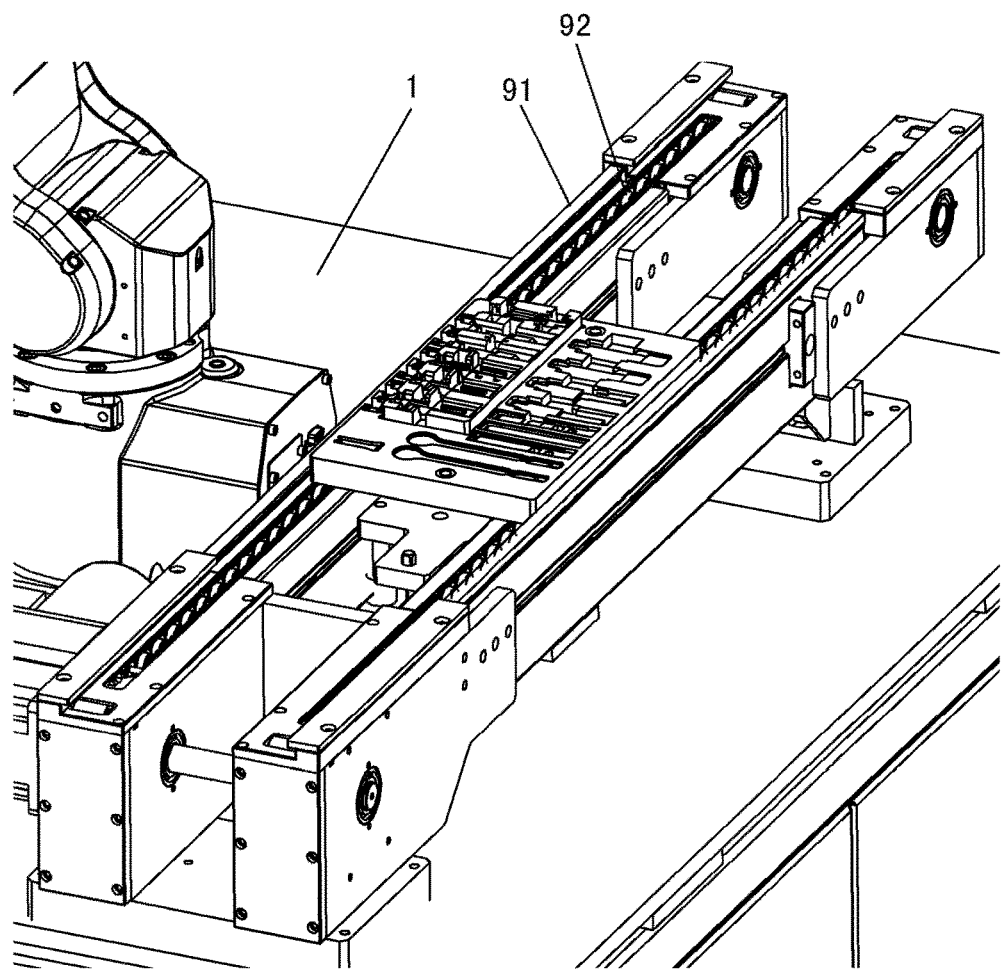
FIG. 13 is a perspective view of a second transmission device of the electronic apparatus production system of FIG. 1.
Figure 18:
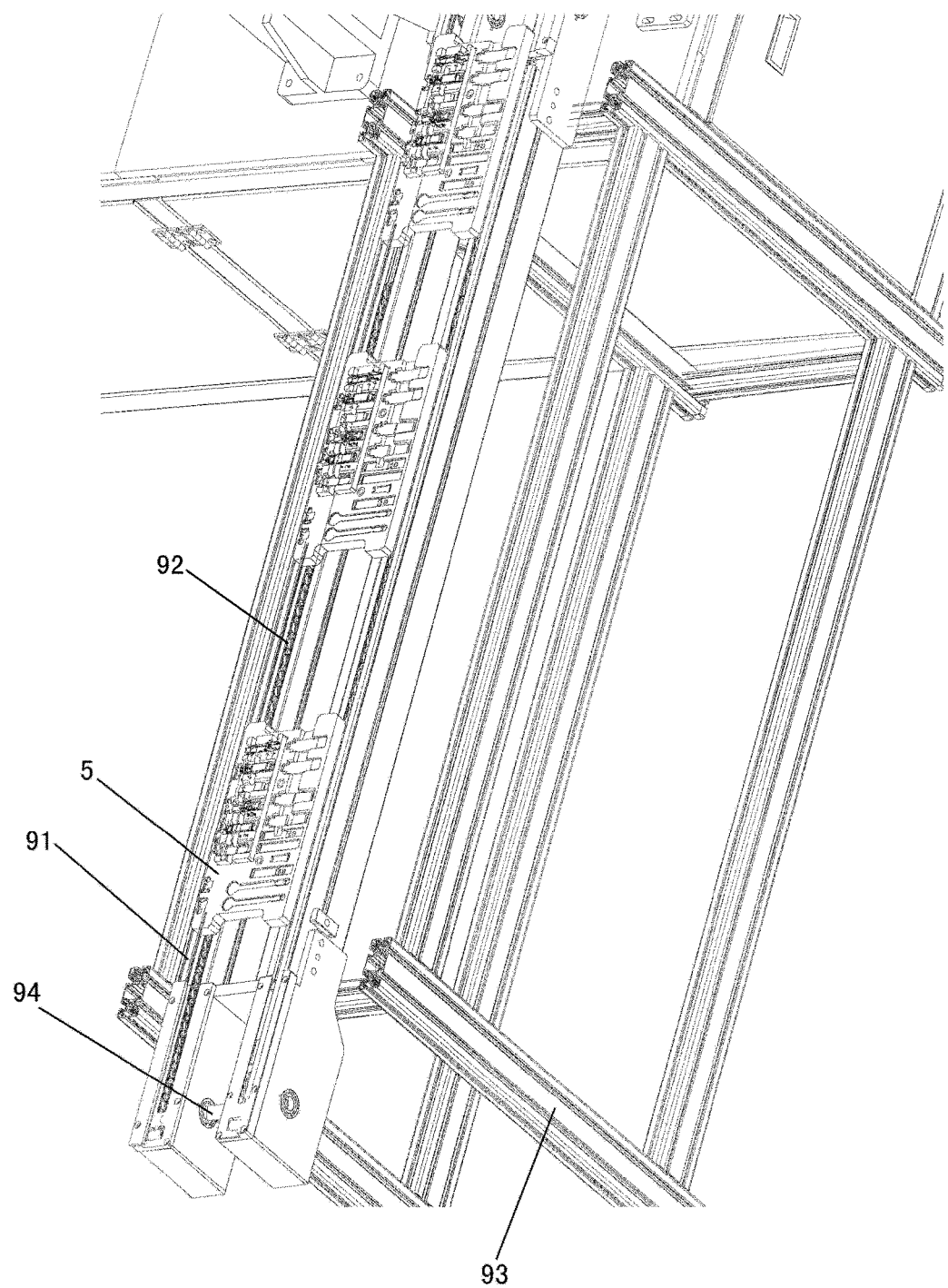
FIG. 18 is an enlarged view of a portion A of FIG. 1.
Figure 20:
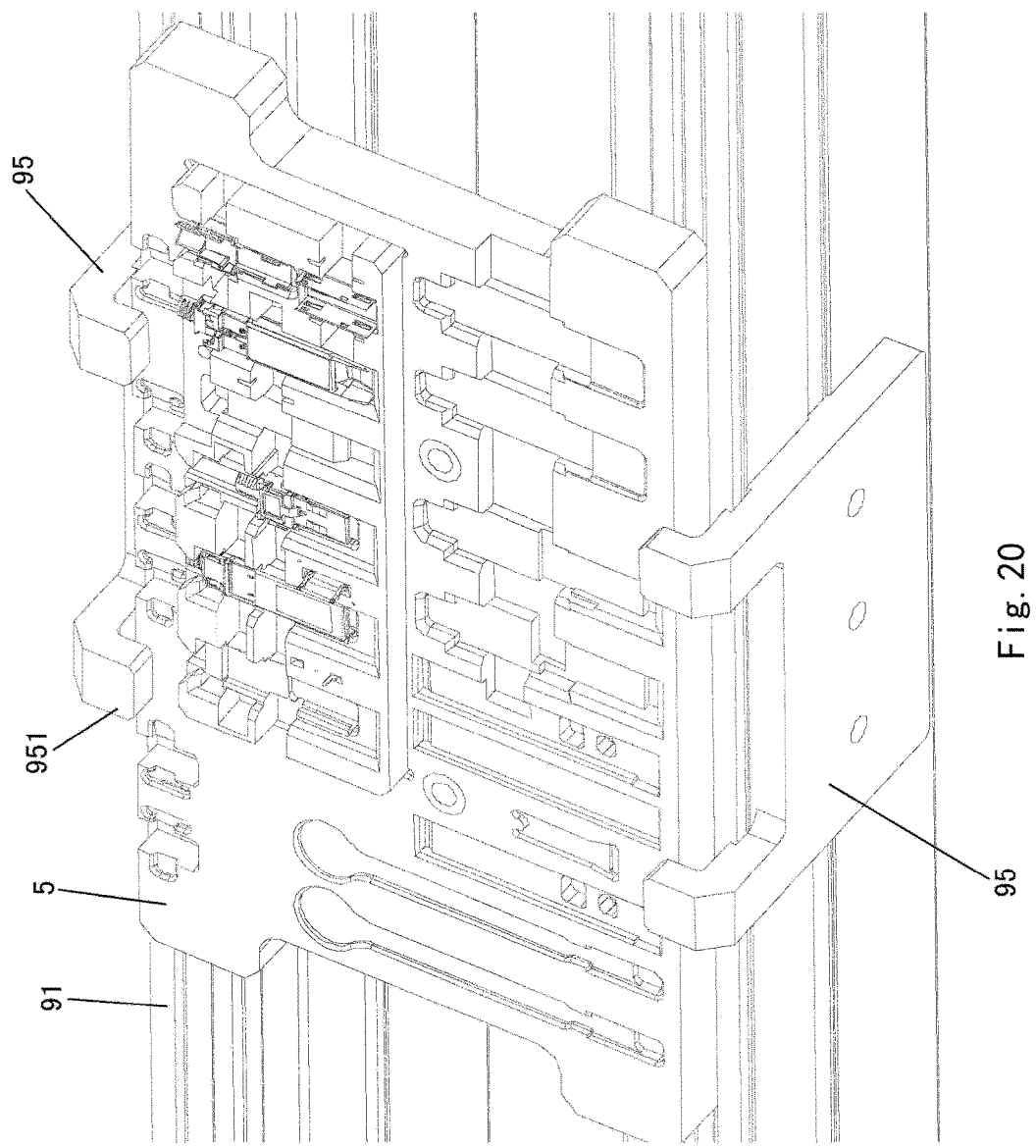
FIG. 20 is a perspective view of a storage tray on the second transmission device of FIG. 13.

The transmission rail 9 is shown in FIGS. 13, 18, and 20. The transmission rail 9 comprises a plurality of second transmission devices. Each second transmission device comprises a fourth support seat 91 mounted on the base 1, a transmission chain 92 mounted on the fourth support seat 91, the storage tray 5 is placed on the transmission chain 92 and is moved onto next worktable with the transmission chain 92, and a driving shaft 94 mounted on the fourth support seat 91. The driving shaft 94 drives the transmission chain 92 to circularly move. In the embodiment shown in FIG. 20, a retaining device 95 is mounted on the fourth support seat 91, and the retaining device 95 is configured to slidably retain the storage tray 5 on the fourth support seat 91. The retaining device 95 is mounted both sides of the fourth support seat 91 in a lateral direction perpendicular to a movement direction of the storage tray 5 and extends above the fourth support seat 91. As shown in FIG. 20, a bending portion 951 extending inward is provided on a distal end of the retaining device 95. With this configuration, it may prevent the storage tray 5 from leaving from the fourth support seat 91 during operating the storage tray 5 (for example, during mounting/removing the components on/from the storage tray).

Figure 3:
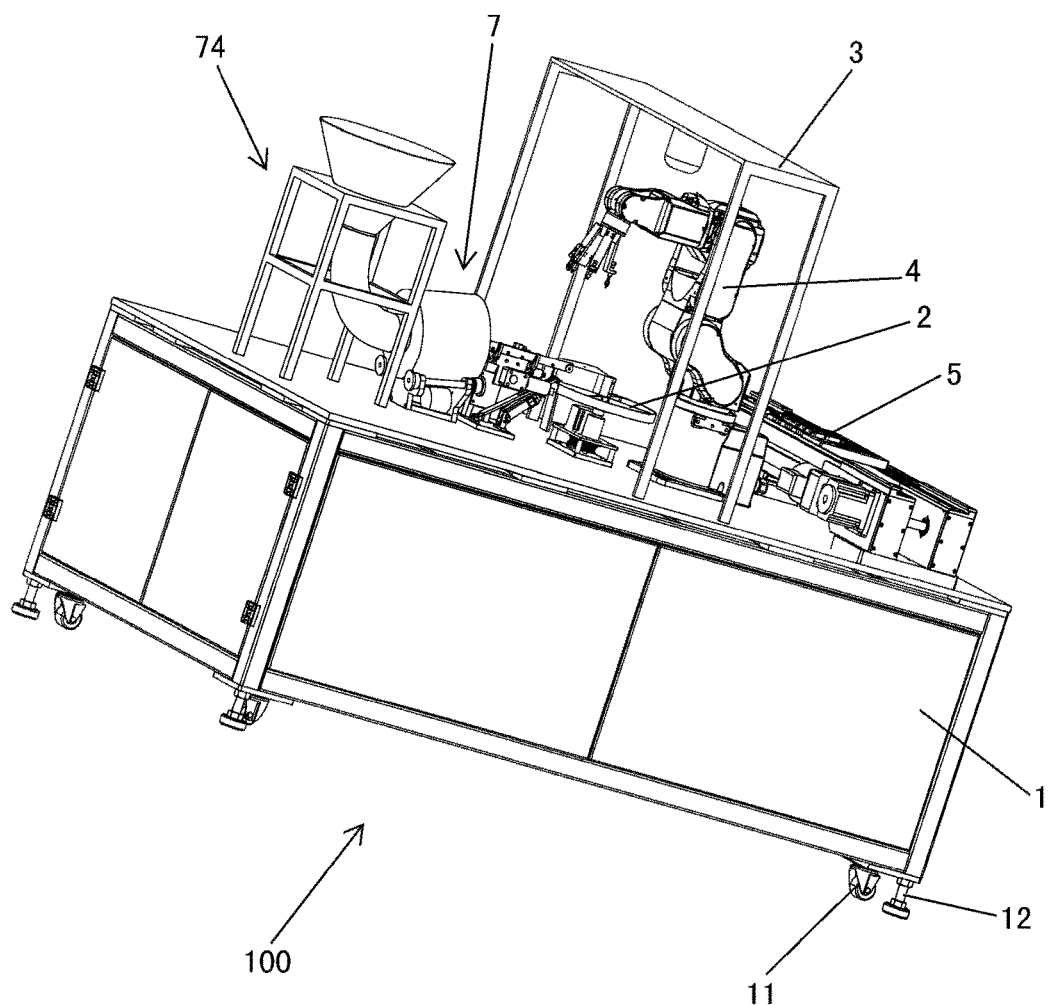
FIG. 3 is a perspective view of the automatic distributor of FIG. 2.
Figure 4:
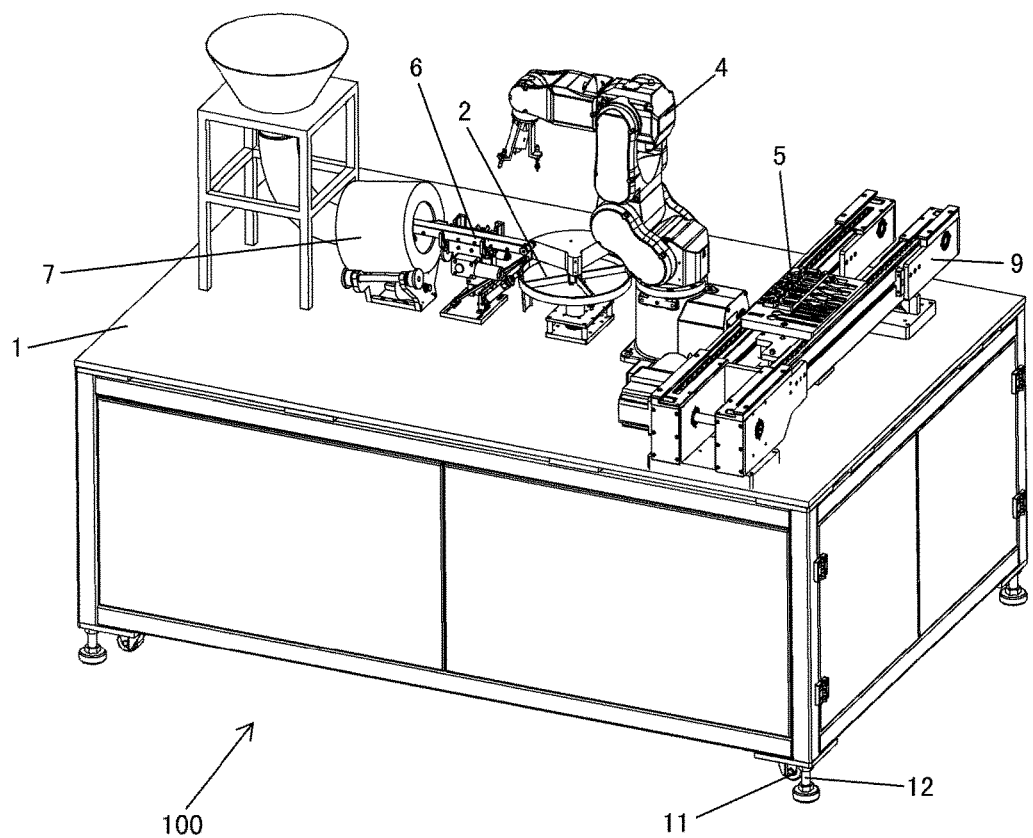
FIG. 4 is a perspective view of the automatic distributor of FIG. 2.

The base 1 is shown in FIGS. 2-4. The base 1 comprises a plurality of wheels 11 mounted on a bottom of the base 1; and a plurality of support legs 12 telescopically mounted on the bottom of the base 1. The storage device 2, the recognition device 3, the pickup device 4, the support tray 5, the first transmission device 6, the second transmission device 54 and the loading device 7 may be all mounted on the base 1. The base 1 may be moved by the wheels 11, so as to move the automatic distributor 100 according to embodiments of the present invention to a predetermined position. When the automatic distributor 100 is moved to the predetermined position, the support legs 12 may be stretched out to suspend the wheels 11, increasing the support strength of the base 1, and preventing the base 1 from being moved. According to actual requirements, it may be possible to mount one or more of the storage device 2, the recognition device 3, the pickup device 4, the support tray 5, the first transmission device 6, the second transmission device 54 and the loading device 7 on the base 1.

Figure 15:
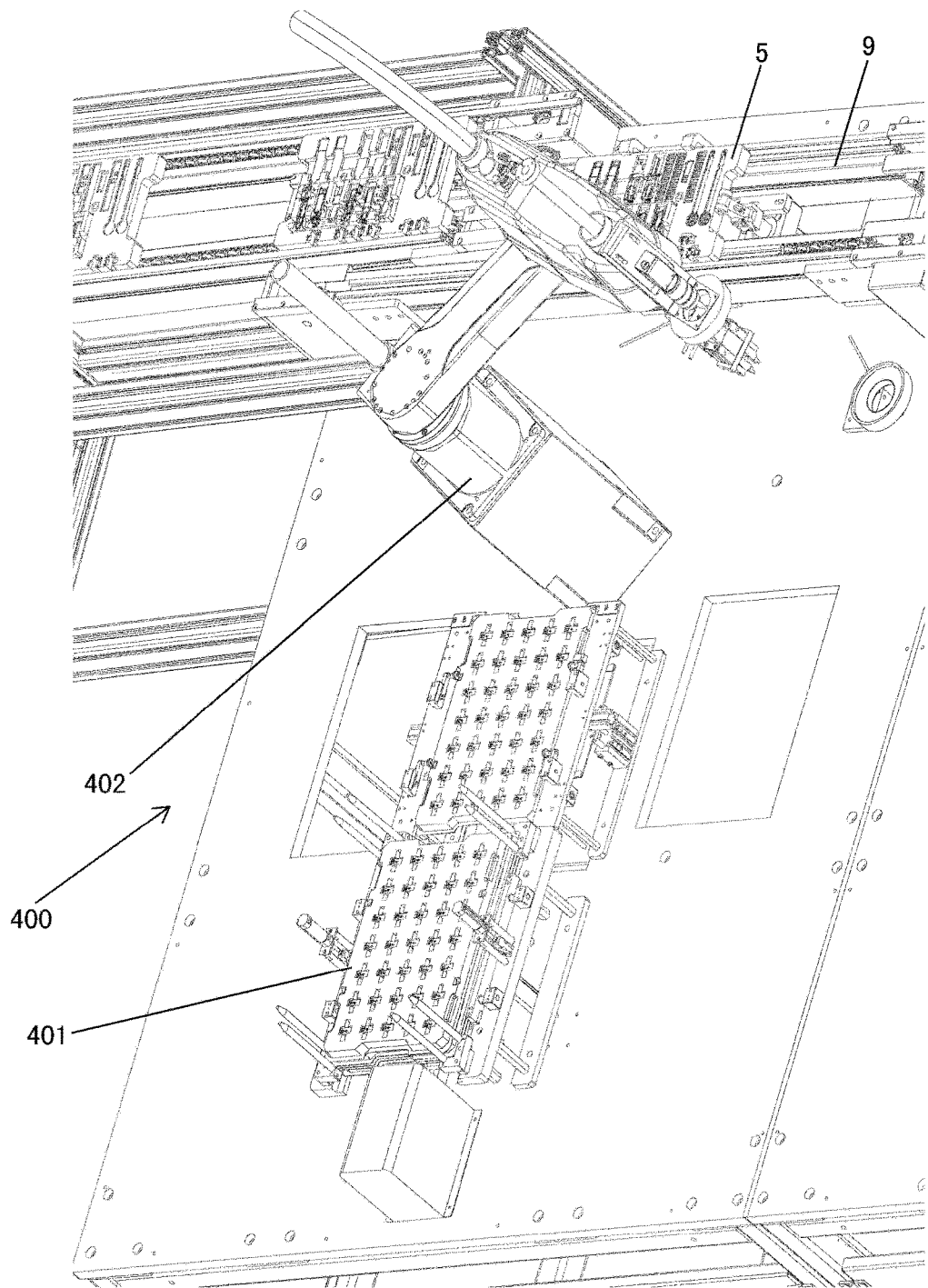
FIG. 15 is a perspective view of a per-distributing apparatus of the electronic apparatus production system of FIG. 1.

The electronic apparatus production system 1000, as shown in FIGS. 1 and 15, comprises at least one pre-distributing apparatus 400 each comprising at least one distributing disk 401 on each of which a plurality of single type of components 200, for example, contacts, springs or the like, are pre-placed, and a second robot 402 configured to grip the components from the distributing disk 401 and mount the gripped components on the storage tray 5. In this way, it may be possible to use the pre-distributing apparatus 400 to mount some pre-grouped components 200 on the storage tray 5. It should be appreciated that the pre-distributing apparatus 400 may be omitted herein.

Figure 16:
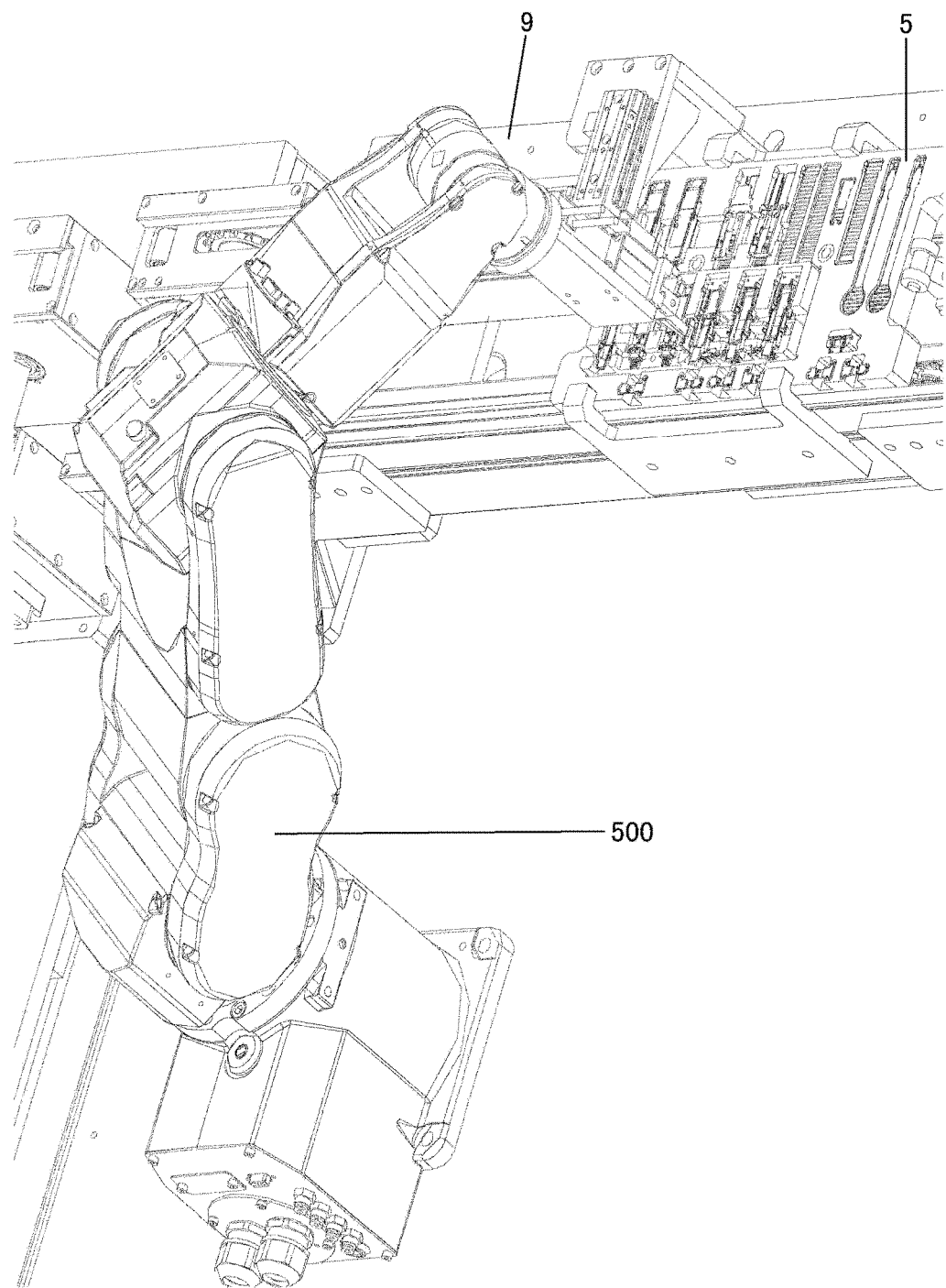
FIG. 16 is a perspective view of a third robot of the electronic apparatus production system of FIG. 1.

The electronic apparatus production system 1000, as shown in FIGS. 1, 16, and 17, comprises at least one third robot 500 mounted at downstream of the automatic distributor 100 in a moving direction of the storage tray 5, each of the at least one third robot 500 is configured to pre-assemble some of the components 200 mounted on the storage tray 5. For example, the third robot picks up a metal sheet 200' of an electronic apparatus from a container 501 and pre-assembles it on a support frame mounted on the holding portion 51-53 of the storage tray 5. In this way, it may reduce the subsequent operation processes. It should be appreciated that the third robot 500 may be omitted herein.

Figure 19:
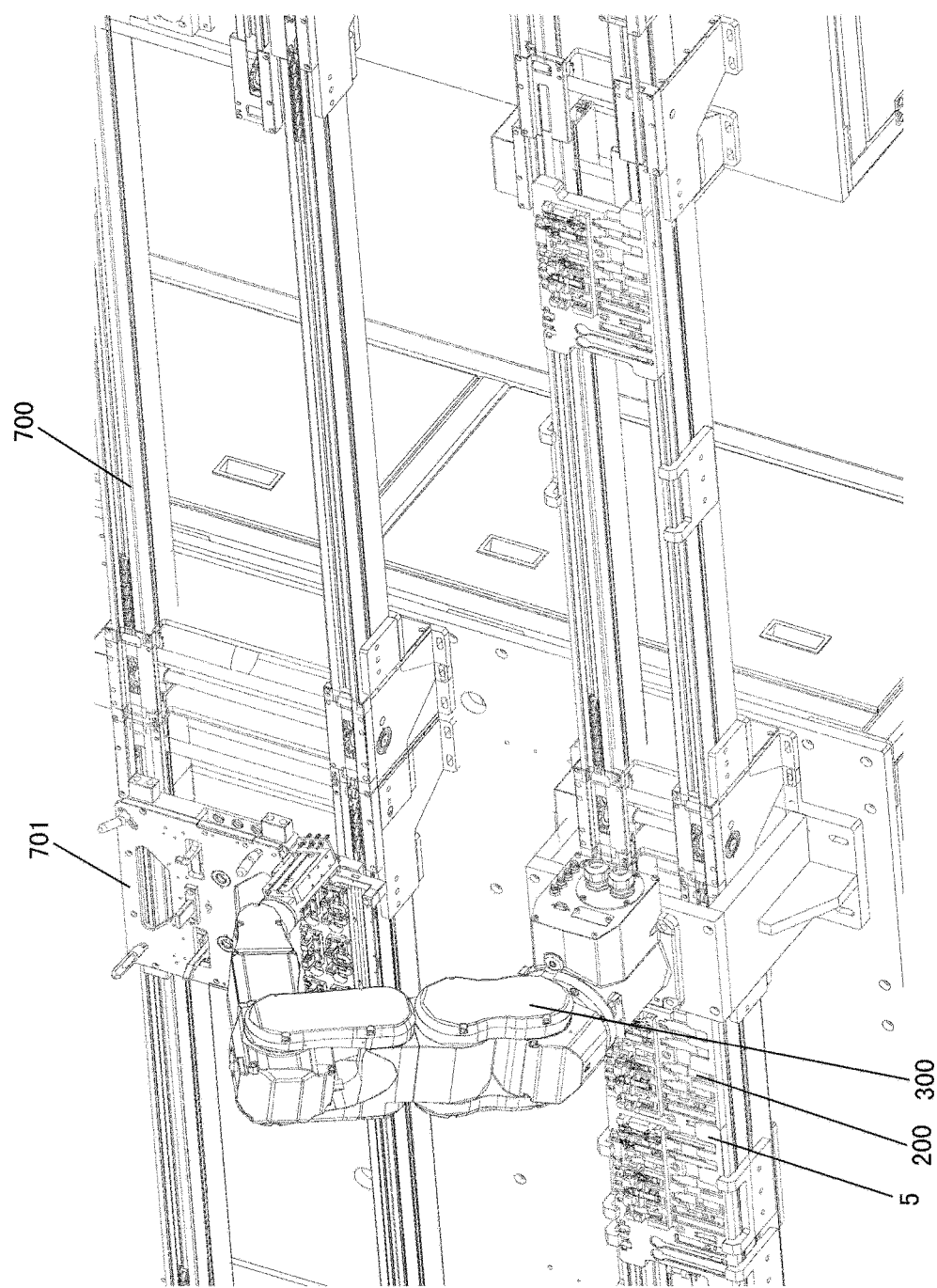
FIG. 19 is a perspective view of an automatic assembler of the electronic apparatus production system of FIG. 1.

The automatic assembler 300, as shown in FIGS. 1 and 19, comprises a fourth robot configured to grip the respective components 200 at a predetermined location on the storage tray 5, on which various components 200 are placed, and assemble the picked components into the electronic apparatus according to a program pre-stored in the fourth robot.

The electronic apparatus production system 1000, as shown in FIGS. 1 and 19, further comprises an auxiliary transmission rail 700 on which an auxiliary tray 701 for carrying the electronic apparatus to be assembled is provided. The auxiliary tray 701 may move on the auxiliary transmission rail 700. In this way, the assembled electronic apparatus may be transmitted to a preset position by means of the auxiliary tray 701, so as to perform further operations, for example, testing, packaging or the like.

Figure 21:
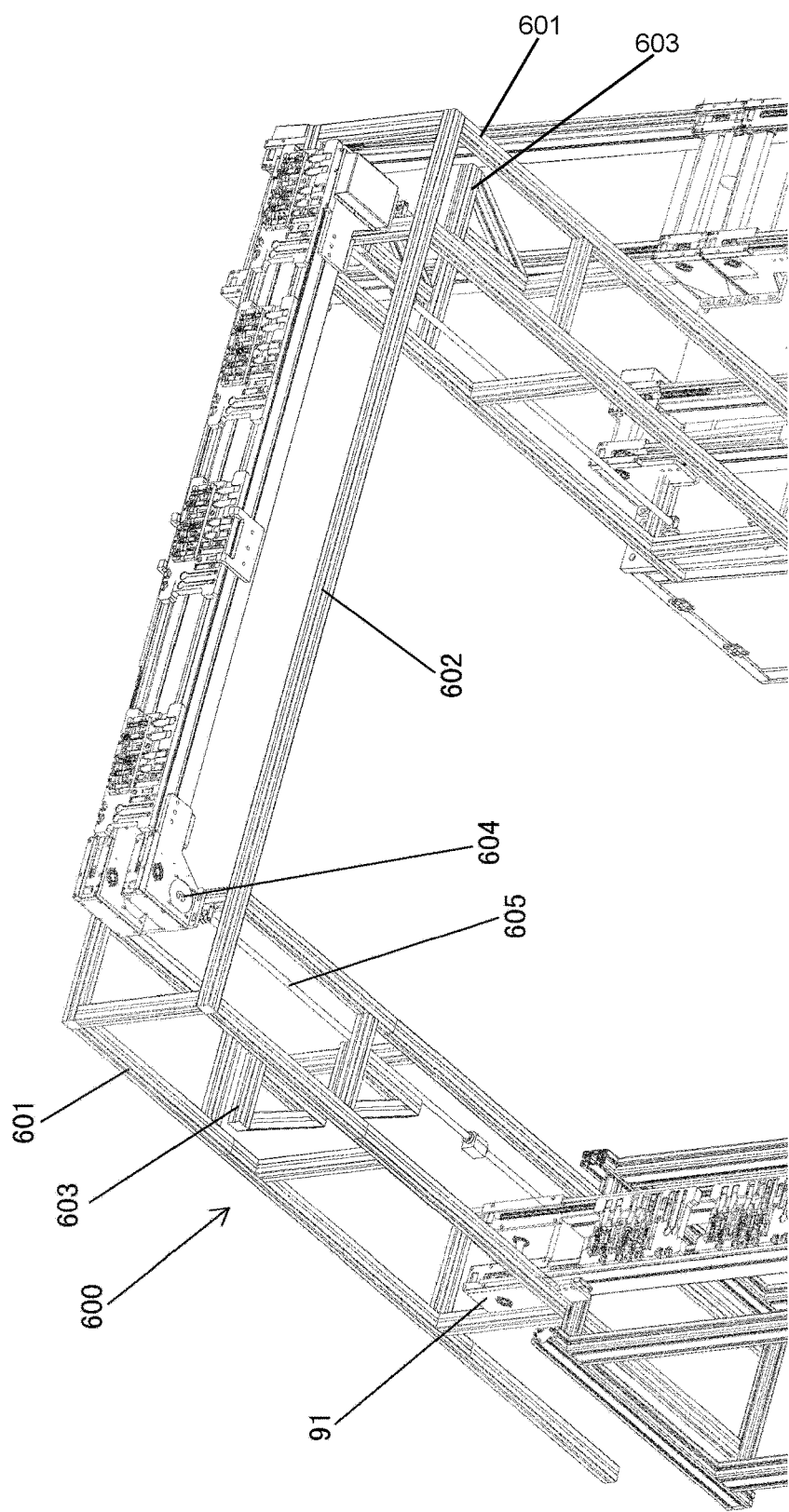
FIG. 21 is a perspective view of a gantry frame of the electronic apparatus production system of FIG. 1.

The electronic apparatus production system 1000, as shown in FIGS. 1 and 21, further comprises at least one gantry frame 600 each comprising two vertical frames 601, one end of the fourth support seat 91 in one of the second transmission devices extends into one of the two vertical frames 601, respectively, a lateral beam 602 supported on the two vertical frames 601 and provided with another second transmission device thereon, and two lifting devices 603 mounted in the two vertical frames 601, respectively, to lift the storage tray 5. A driving motor 604 is provided in the second transmission device mounted on the lateral beam 602. The driving motor 604 is connected to the lifting device 603 via a cable 605. The driving motor 604 may drive the lifting device 603 up and down by means of the cable 605.

The storage tray 5 moved to the end of the fourth support seat 91 may be further moved onto the lifting device 603 flush with the fourth support seat 91 under the driving of the transmission chain. Then, the driving motor 604 drives the lifting device 603 to rise, so as to lift the storage tray 5 to a level flush with the second transmission device on the lateral beam 602, and then drive the storage tray 5 to move onto the second transmission device on the lateral beam 602. Thereafter, the storage tray 5 is lifted down in the other vertical frame 601 and moved onto another second transmission device. In this way, it achieves a discontinuous circulating movement of the storage tray 5. Generally, the gantry frame 600 has a height substantially the same as that of an operator, for facilitating the operator to enter the electronic apparatus production system.

A rotation device and a driving mechanism may be provided on the lifting device 603. The rotation device is configured to rotate the storage tray 5 moved onto the lifting device 603 by an angle of about 90 degrees, and the driving mechanism is configured to push the storage tray 5, moved onto the lifting device 603 flush with the second transmission device on the lateral beam 602, onto the second transmission device on the lateral beam 602, so that the storage tray 5 continues to move on the second transmission device on the lateral beam 602. Similarly, a similar rotation device and a similar driving mechanism may be provided at a joint of the other two second transmission devices perpendicular to each other, so as to rotate the storage tray 5 by an angle of about 90 degrees, and push the storage tray 5 onto a next second transmission device. By means of the rotation device and the driving mechanism, the storage tray 5 may be smoothly transmitted between two second transmission devices perpendicular to each other.

In another embodiment, as shown in FIGS. 1 and 18, the transmission rail 9 further comprises a supporting frame 93. The supporting frame 93 has a height substantially the same as that of the base 1. A portion of the fourth support seat 91 is mounted on the supporting frame 93. The supporting frame 93 may support the transmission rail 9 between bases for different robots, so as to achieve a smooth transition of the transmission rail 9 between the bases for different robots. In various embodiments of the present invention, the second transmission devices, except the second transmission device at the gantry frame 600, are substantially located in the same horizontal plane, so as to achieve a smooth transition and connection between adjacent second transmission devices.

Advantageously, in the electronic apparatus production system 1000 according to the invention, the automatic distributor 100 recognizes components 200 to be distributed, picks up the components 200 based on a recognition result, and regularly places the picked components 200 on the storage tray 5, so as to prepare components 200 of an electronic apparatus to be assembled in advance, increasing the automation level of manufacturing the electronic apparatus. From the funnel portion 742 to the storage device 5, the respective devices continuously operate, which avoids causing the entire electronic apparatus production system 1000 to stop due to a lack of initially supplied components 200.

What is claimed is:

1. An electronic apparatus production system, comprising:
   a transmission rail in the form of a loop with an opening;
   a plurality of storage trays circulating on the transmission rail, each of the storage trays comprising a plurality of holding portions to hold a plurality of components with different shapes;
   an automatic distributor configured to mount the components with different shapes on the respective holding portions of the plurality of storage trays further comprising:
   a base;
   a storage device mounted on the base and configured to store the plurality of components;
   a first transmission device configured to transmit the components onto the storage device the first transmission device further having:
   a second support seat mounted on the base,
   a conveyer belt assembly mounted on the second support seat and having a receiving end for receiving the components and a releasing end for releasing the components wherein an angle of a surface of the conveyer belt assembly with respect to a horizontal plane is adjustable in a lateral direction perpendicular to a transmitting direction of the conveyer belt, and
   a second motor mounted on the second support seat and configured to drive a conveyer belt of the conveyer belt assembly,
   a recognition device configured to recognize the components on the storage device;
   a pickup device configured to pick up the components on the storage device and place the components on the respective holding portions of the storage tray according to a recognition result of the recognition device; and
   an automatic assembler configured to grip the plurality of components on the plurality of storage trays.

2. The electronic apparatus production system according to claim 1, wherein the storage device comprises a support tray configured to store the plurality of components.

3. The electronic apparatus production system according to claim 2, wherein the storage device further comprises a first support seat mounted on the base, the support tray mounted on the first support seat.

4. The electronic apparatus production system according to claim 3, wherein the support tray has a circular shape, and the storage device further comprises a first motor mounted on the first support seat, the first motor configured to drive the support tray to rotate.

5. The electronic apparatus production system according to claim 4, wherein the support tray has a plurality of division plates extending in a radial direction to divide the support tray into a plurality of storage sections having a fanlike shape.

6. The electronic apparatus production system according to claim 4, wherein the support tray has a ring-shaped blocking plate disposed on a periphery of the support tray.

7. The electronic apparatus production system according to claim 4, wherein the support tray has a fanlike blocking plate disposed on the support tray.

8. The electronic apparatus production system according to claim 2, wherein the storage device further comprises a vibration device mounted on the base under the support tray and configured to vibrate the support tray.

9. The electronic apparatus production system according to claim 1, wherein the recognition device comprises:
   a first support frame mounted on the base; and
   a camera mounted on the first support frame to capture images of the components stored on the storage device.

10. The electronic apparatus production system according to claim 9, wherein the recognition device further comprises a light source configured to illuminate the components stored on the storage device.

11. The electronic apparatus production system according to claim 1, wherein the automatic distributor further comprises a loading device configured to load the components onto the receiving end of the conveyer belt assembly.

12. The electronic apparatus production system according to claim 11, wherein the loading device comprises:
    a rolling drum, orientated in a horizontal direction, into which the receiving end of the conveyer belt assembly is inserted in a horizontal direction;
    a driving device configured to drive the rolling drum to rotate; and
    a scraping plate mounted on an inner wall of the rolling drum in an axial direction.

13. The electronic apparatus production system according to claim 12, wherein the loading device further comprises an input device communicated with an inner space of the rolling drum at an end of the rolling drum opposite to an end of the rolling drum receiving the receiving end of the conveyer belt assembly, so as to input the components into the rolling drum.

14. The electronic apparatus production system according to claim 12,
    wherein the driving device comprises:
    a third support seat mounted on the base;
    a third motor mounted on the third support seat; and
    a plurality of rolling shafts mounted on the third support seat and rotatably engaged with an outer surface of the rolling drum, so as to drive the rotation of the rolling drum under the driving of the third motor.

15. The electronic apparatus production system according to claim 1, wherein the second support seat comprises at least two arcuate brackets each comprising:
    an arcuate groove;
    a plurality of passageways arranged in an arcuate shape along the periphery of the arcuate groove; and
    a lateral bracket on which the conveyer belt assembly is mounted, both ends of the lateral bracket are selectively engaged in two passageways of the plurality of passageways so that the lateral bracket moves on a portion of the arcuate groove and has a changeable posture.

16. The electronic apparatus production system according to claim 1, wherein the automatic distributor has a pickup device is a first robot and comprises a plurality of grippers adapted to pick up the components with different shapes.

17. The electronic apparatus production system according to claim 1, wherein a base comprises:
    a plurality of wheels mounted on a bottom of the base; and
    a plurality of support legs telescopically mounted on the bottom of the base.

18. The electronic apparatus production system according to claim 1, further comprising a pre-distributing apparatus comprising:
    a distributing disk on which a plurality of a single type of components are pre-placed; and a second robot configured to grip the plurality of a single type of components from the distributing disk and mount the plurality of a single type of components on the storage tray.

19. The electronic apparatus production system according to claim 1, further comprising a third robot mounted downstream of the automatic distributor in a moving direction of the storage tray, the third robot configured to pre-assemble some of the components mounted on the storage tray.

20. The electronic apparatus production system according to claim 1, wherein the transmission rail comprises a plurality of connected second transmission devices, each of the second transmission devices comprises:
 a fourth support seat mounted on a base;
 a transmission chain mounted on the fourth support seat, the storage tray placed on the transmission chain so as to move with the transmission chain; and
 a driving shaft mounted on the fourth support seat and driving the transmission chain to circularly move.

21. The electronic apparatus production system according to claim 20, wherein a retaining device is mounted on the fourth support seat, the retaining device configured to slidably retain the storage tray on the fourth support seat.

22. The electronic apparatus production system according to claim 20, further comprising a gantry frame comprising:
 two vertical frames;
 a lateral beam supported on the two vertical frames and having one of the second transmission devices disposed thereon; and
 two lifting devices mounted on the two vertical frames, respectively, to lift the storage tray, an end of one of the second transmission devices extends into one of the two vertical frames.

23. The electronic apparatus production system according to claim 20, wherein the transmission rail further comprises a supporting frame having a height equal to that of the base, and the fourth support seat is mounted on the supporting frame.

24. The electronic apparatus production system according to claim 1, further comprising an auxiliary transmission rail on which an auxiliary tray for carrying an electronic apparatus to be assembled is disposed.

* * * * *